United States Patent
Campbell et al.

(10) Patent No.: US 7,421,675 B1
(45) Date of Patent: Sep. 2, 2008

(54) ANNOTATING TIMING INFORMATION FOR A CIRCUIT DESIGN FOR INCREASED TIMING ACCURACY

(75) Inventors: Scott J. Campbell, Frederick, CO (US); Mario Escobar, Boulder, CO (US); Jaime D. Lujan, Louisville, CO (US); Walter A. Manaker, Jr., Boulder, CO (US); Brian D. Philofsky, Longmont, CO (US)

(73) Assignee: XILINX, Inc., San Jose, CA (US)

( * ) Notice: Subject to any disclaimer, the term of this patent is extended or adjusted under 35 U.S.C. 154(b) by 100 days.

(21) Appl. No.: 11/333,863

(22) Filed: Jan. 17, 2006

(51) Int. Cl.
*G06F 9/45* (2006.01)
*G06F 17/50* (2006.01)
(52) U.S. Cl. .................. 716/6; 716/4; 716/5; 703/19
(58) Field of Classification Search .............. 716/4, 716/5, 6, 10; 714/726; 703/19
See application file for complete search history.

(56) References Cited

U.S. PATENT DOCUMENTS

| | | | |
|---|---|---|---|
| 5,517,658 A | 5/1996 | Gluss et al. | |
| 6,480,817 B1 | 11/2002 | Peters et al. | |
| 6,487,701 B1 | 11/2002 | Dean et al. | |
| 6,557,150 B1 | 4/2003 | Honmura et al. | |
| 6,611,948 B1 | 8/2003 | Tyler et al. | |
| 6,857,110 B1 | 2/2005 | Rupp et al. | |
| 2003/0014724 A1* | 1/2003 | Kojima et al. | 716/10 |
| 2003/0110462 A1* | 6/2003 | Cohn et al. | 716/6 |
| 2005/0268266 A1* | 12/2005 | Bowers et al. | 716/6 |
| 2006/0066317 A1* | 3/2006 | Koch et al. | 324/618 |
| 2006/0230373 A1* | 10/2006 | Dirks et al. | 716/6 |
| 2007/0011527 A1* | 1/2007 | Goswami et al. | 714/726 |
| 2007/0089076 A1* | 4/2007 | Amatangelo | 716/6 |

OTHER PUBLICATIONS

U.S. Appl. No. 12/047,502 by Lujan et al.; filed on Mar. 13, 2008. Xilinx, Inc., 2100 Logic Dr., San Jose, CA 95124
U.S. Appl. No. 11/433,127 by Campbell et al.; filed on May 12, 2006. Xilinx, Inc., 2100 Logic Dr., San Jose, CA 95124

* cited by examiner

*Primary Examiner*—Paul Dinh
*Assistant Examiner*—Nha Nguyen
(74) *Attorney, Agent, or Firm*—Kevin T. Cuenot

(57) ABSTRACT

A method of annotating timing information for a circuit design for performing timing analysis can include determining minimum and maximum clock path delays for registers of a circuit design and computing a difference between the maximum clock path delay and the minimum clock path delay for a destination register of the circuit design. The method further can include adjusting a register timing parameter for the destination register according to the difference and performing a timing verification on the destination register using the adjusted register timing parameter.

13 Claims, 3 Drawing Sheets

ANNOTATING TIMING INFORMATION FOR A CIRCUIT DESIGN FOR INCREASED TIMING ACCURACY

BACKGROUND

1. Field of the Invention

The present invention relates to the simulation of circuit designs and, more particularly, to increasing the accuracy of timing analysis with respect to circuit designs.

2. Description of the Related Art

The operational speed of modern circuit designs has continually increased. This increase in speed requires highly accurate techniques for conducting timing analysis so that the designs can be adequately tested and verified. Typically, this sort of testing is performed using an Electronic Design Automation (EDA) tool. The EDA tool essentially analyzes a circuit design, which can be expressed using a hardware description language, as well as a timing description of the circuit design.

While the timing description of the circuit design may be expressed using any of a variety of different formats, one common way of expressing this data is through a Standard Delay Format (SDF) file. The Standard Delay Format Specification is available to developers from Open Verilog International. In general, an SDF file stores timing data for a circuit design. The data in the SDF file can represent design parameters including, but not limited to, delays, timing checks such as setup, hold, recovery, removal, skew, width, and period, timing constraints, as well as conditional and unconditional module path delays. This data is represented in a design tool-independent manner and, as such, can be used by a variety of different EDA tools.

SDF files have become an industry standard in terms of representing delay information for circuit designs. Still, there are disadvantages in the way that data from SDF files is used when computing various timing related quantities. More particularly, the SDF file format specifies that only one delay for each path is to be annotated for a given functional timing simulation. In illustration, an SDF file can include delay constructs that specify the minimum, typical, and maximum path delays for components of a circuit design. Presently, these values are not utilized simultaneously within a given functional timing simulation. That is, when a particular timing analysis is performed, such as setup or hold verification for example, either all maximum path delays or all minimum path delays are used for each component. This can lead to situations in which erroneous or overly optimistic timing analysis is performed on the circuit design.

It would be beneficial to perform various timing analysis operations for circuit designs in a manner which overcomes the limitations described above.

SUMMARY

The present invention provides a method and article of manufacture relating to timing analysis for circuit designs. One embodiment of the present invention can include a method of annotating timing information for a circuit design for performing timing analysis. The method can include determining a minimum clock path delay and a maximum clock path delay for a destination register of the circuit design. A difference between the maximum clock path delay and the minimum clock path delay for the destination register can be computed. A setup time for the destination register of the circuit design can be adjusted according to the difference.

The method also can include performing setup verification for the destination register using the adjusted setup time for the destination register and a maximum clock path delay for the source register. The determining step can include executing a static timing analysis engine to determine the clock path delays. The adjusting step can include increasing the setup time for the destination register by an amount equal to the difference calculated between the maximum clock path delay and the minimum clock path delay for the destination register.

The setup verification performed using the adjusted setup time can approximate a calculation for setup verification of the destination register using a maximum clock path delay for the source register and a minimum clock path delay for the destination register. The setup verification step also can include using a measure of maximum data path delay between the source register and the destination register. The adjusted setup time for the destination register can be specified within a Standard Delay Format (SDF) file for the circuit design.

Another embodiment of the present invention can include a method of annotating timing information for a circuit design for performing timing analysis which includes determining a minimum clock path delay and a maximum clock path delay for a destination register of a circuit design. A difference between the maximum clock path delay and the minimum clock path delay for the destination register can be computed. A hold time for the destination register of the circuit design can be adjusted according to the difference.

The method further can include performing hold verification for the destination register using the adjusted hold time of the destination register and a minimum clock path delay for the source register. The determining step can include executing a static timing analysis engine to determine the clock path delays. The adjusting step can include increasing the hold time for the destination register by an amount equal to the difference calculated between the maximum clock path delay and the minimum clock path delay for the destination register.

The step of performing hold verification using the adjusted hold time can approximate a calculation for hold verification of the destination register using a minimum clock path delay for the source register and a maximum clock path delay for the destination register. The step of performing hold verification further can include using a measure of minimum data path delay between the source register and the destination register. The adjusted hold time for the destination register can be specified within an SDF file corresponding to the circuit design.

Yet another embodiment of the present invention can include a machine readable storage, having stored thereon a computer program having a plurality of code sections including code for determining minimum and maximum clock path delays for registers of a circuit design, code for computing a difference between the maximum clock path delay and the minimum clock path delay for a destination register of the circuit design, and code for adjusting a register timing parameter for the destination register according to the difference. The machine readable storage further can include code for performing a timing verification on the destination register using the adjusted register timing parameter, as well as code for specifying the adjusted register timing parameter within an SDF file.

In one embodiment, the register timing parameter can specify setup time of the destination register. Accordingly, the code for adjusting a register timing parameter further can include code for increasing the setup time of the destination register by an amount equivalent to the difference. The code for performing a timing verification can include code for performing setup verification, wherein the setup verification using the adjusted setup time approximates a calculation for setup verification of the destination register using a maximum clock path delay for a source register and a minimum clock path delay for the destination register. The code for performing a timing verification further can include code for incorporating a measure of maximum data path delay between the source register and the destination register.

In another embodiment, the register timing parameter can specify hold time of the destination register. In that case, the code for adjusting a register timing parameter further can include code for increasing the hold time of the destination register by an amount equivalent to the difference. The code for performing a timing verification can include code for performing hold verification, wherein the hold verification using the adjusted hold time approximates a calculation for hold verification of the destination register using a minimum clock path delay for a source register and a maximum clock path delay for the destination register. The code for performing a timing verification also can include code for incorporating a measure of minimum data path delay between the source register and the destination register.

BRIEF DESCRIPTION OF THE DRAWINGS

There are shown in the drawings, embodiments which are presently preferred, it being understood; however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The present invention provides a solution for performing timing analysis upon a circuit design with increased accuracy. The embodiments disclosed herein can be used for performing timing analysis upon programmable logic devices including, but not limited to, field programmable gate arrays (FPGAs). In accordance with the embodiments disclosed herein, timing data for a circuit design, as may be expressed within a Standard Delay Format (SDF) file, can be annotated. In one embodiment, for example, setup and/or hold timing information can be adjusted for various components. Adjusting this timing information effectively allows minimum and maximum path delays for a given component to be used concurrently when performing different timing analysis functions.

Figure 1:
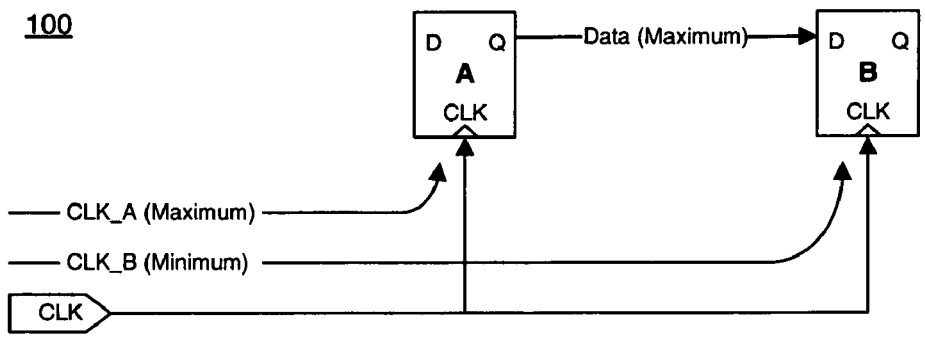
FIG. 1 is a block diagram illustrating a circuit design which is useful for understanding the embodiments disclosed herein.

FIG. 1 is a block diagram illustrating a circuit design 100 which is useful for understanding the embodiments disclosed herein. FIG. 1 illustrates a scenario for performing setup verification which results in increased accuracy. As shown, circuit 100 includes register A and register B, each driven by a common clock. To accurately perform setup verification for register B, the arrival time of the clock edge at register B, also referred to as the destination register, should be considered to occur at the earliest moment in time in relation to the arrival time of the clock edge at register A, which can be referred to as the source register.

To do so, setup verification calculations should utilize the maximum clock path delay for register A and the minimum clock path delay for register B. In addition, the data path between register A and register B should be considered to use maximum path delays through all elements on the data path. With these assumptions, an accurate calculation of setup verification for register B can be performed. Because the SDF file allows the annotation of only one delay for each path, however, all paths for performing setup simulation typically are annotated as maximum delays. In consequence, it is often the case that setup verification calculations for a circuit design are too optimistic and potentially inaccurate.

Figure 2:
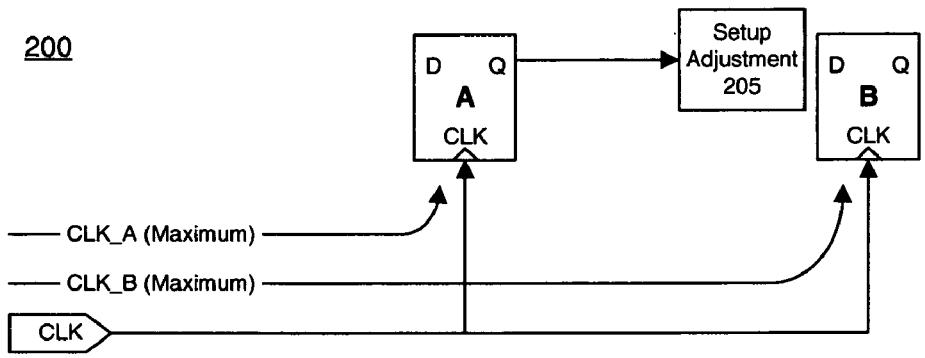
FIG. 2 is a block diagram illustrating a circuit design in accordance with one embodiment of the present invention.

FIG. 2 is a block diagram illustrating a circuit design 200 in accordance with one embodiment of the present invention. As shown, the clock path delays for each of registers A and B are considered to be maximum clock path delays. The setup time requirement for register B, however, has been modified by adding a setup adjustment 205. The increased setup time requirement for the destination register, i.e., register B, effectively mimics the situation illustrated with reference to FIG. 1. That is, for purposes of setup verification, a maximum clock path delay is used for register A and an effective minimum clock path delay is used for register B.

Figure 3:
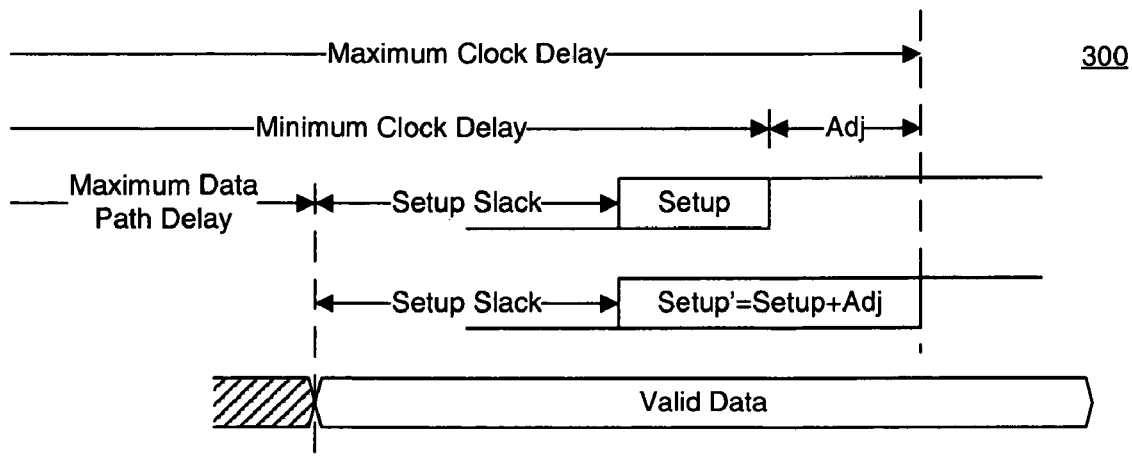
FIG. 3 is a timing diagram illustrating the annotation of timing information with respect to the setup time for a target register in accordance with the embodiments disclosed herein.

FIG. 3 is a timing diagram 300 illustrating the annotation of timing information with respect to setup time for a destination register in accordance with the embodiments disclosed herein. As shown, the amount of adjustment (Adj) to the setup time required for register B can be approximately that of, or equivalent to, the difference between the maximum clock path delay for register B and the minimum clock path delay for register B. By annotating the timing information, i.e., an SDF file, such that the setup time for register B is increased, the result is that a minimum clock path delay effectively is used in the context of setup verification analysis for register B. Accordingly, when a setup verification analysis is performed by an EDA tool (which may be configured to use all "maximum" values), the calculation produces a more reliable and accurate result since the maximum clock path delay for register A and a quantity representing a minimum clock path delay for register B, through the adjusted setup time, are used.

Figure 4:
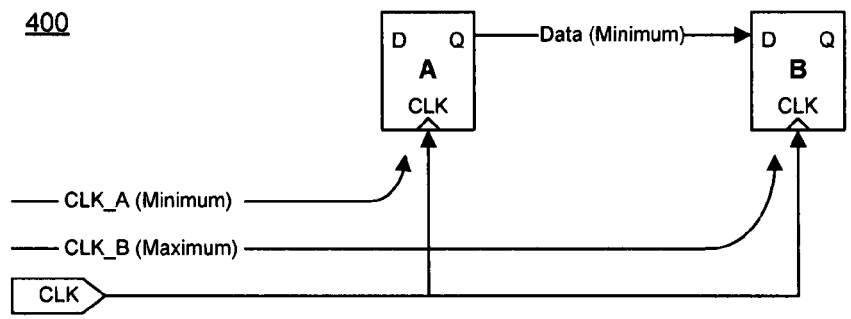
FIG. 4 is a block diagram illustrating a circuit design which is useful for understanding the embodiments disclosed herein.

FIG. 4 is a block diagram illustrating a circuit design which is useful for understanding the embodiments disclosed herein. FIG. 4 illustrates a scenario for performing hold verification which results in increased accuracy. As shown, circuit 400 includes register A and register B, each driven by a common clock. To accurately perform hold verification, the arrival time of the clock edge at destination register B should be considered to occur at the latest moment in time in relation to the arrival time of the clock edge at source register A.

Hold verification calculations for register B should utilize the minimum clock path delay for register A and the maximum clock path delay for register B. In the case of hold verification, the data path between register A and register B should be considered to use minimum path delays through all elements on the data path. Using the assumptions noted above, an accurate calculation of hold verification for circuit 400 can be performed. As noted, however, the SDF file allows the annotation of only one delay for each path. Thus, with respect to hold verification, all paths typically are annotated using minimum path delays. In consequence, it is often the case that the hold verification calculations for a circuit design, like conventional setup verification calculations, are too optimistic and potentially inaccurate.

Figure 5:
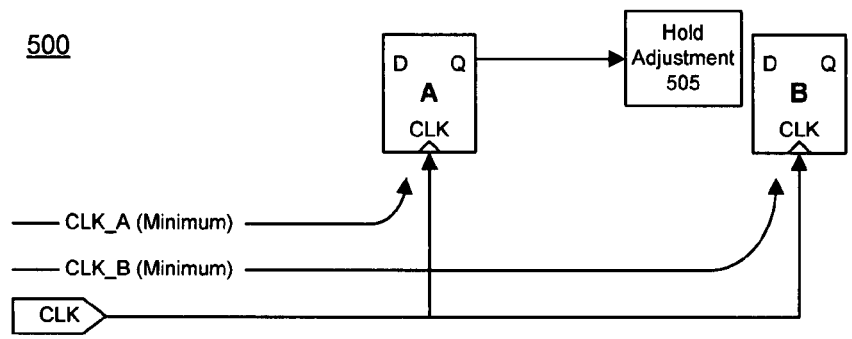
FIG. 5 is a block diagram illustrating a circuit design in accordance with another embodiment of the present invention.

FIG. 5 is a block diagram illustrating a circuit design 500 in accordance with another embodiment of the present invention. As shown, the clock path delays for each of registers A and B are considered to be minimum clock path delays. The hold time requirement for register B, however, has been modified by adding a hold adjustment 505. The increased hold time requirement for register B effectively mimics the situation illustrated with reference to FIG. 4 where a minimum clock path delay is used for register A and a maximum clock path delay is used for register B when performing hold verification for register B.

Figure 6:
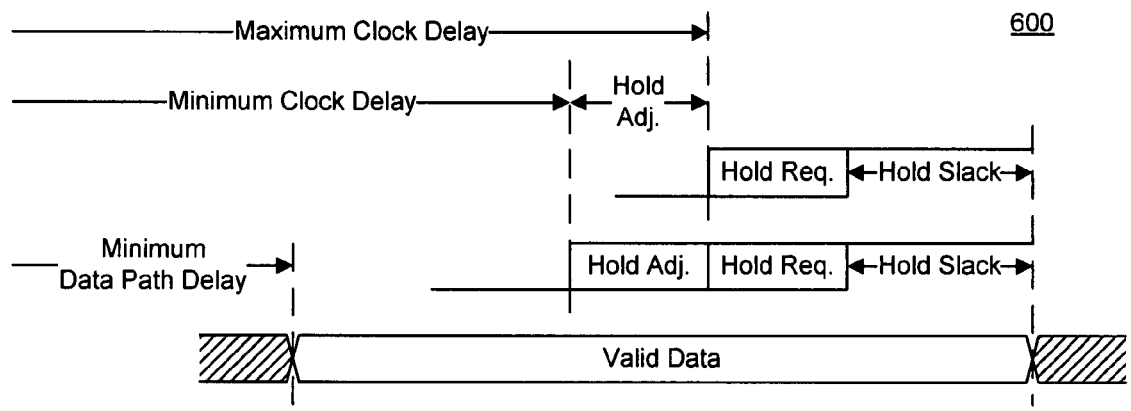
FIG. 6 is a timing diagram illustrating the annotation of timing information with respect to the hold time for a destination register in accordance with the embodiments disclosed herein.

FIG. 6 is a timing diagram 600 illustrating the annotation of timing information with respect to the hold time for a destination register in accordance with the embodiments disclosed herein. As shown, the amount of adjustment (Hold Adj.) to the hold time requirement for register B can be approximately that of, or equivalent to, the difference between the maximum clock path delay for register B and the minimum clock path delay for register B. By annotating the timing information, i.e., an SDF file, such that the hold time requirement for register B is increased, the minimum clock path delay effectively can reflect a maximum clock path delay. Accordingly, when hold verification is performed by an EDA tool for register B, the calculation produces a more reliable and accurate result since the minimum clock path delay for register A and a quantity representing a maximum clock path delay for register B, through the adjusted hold time, are used.

Figure 7:
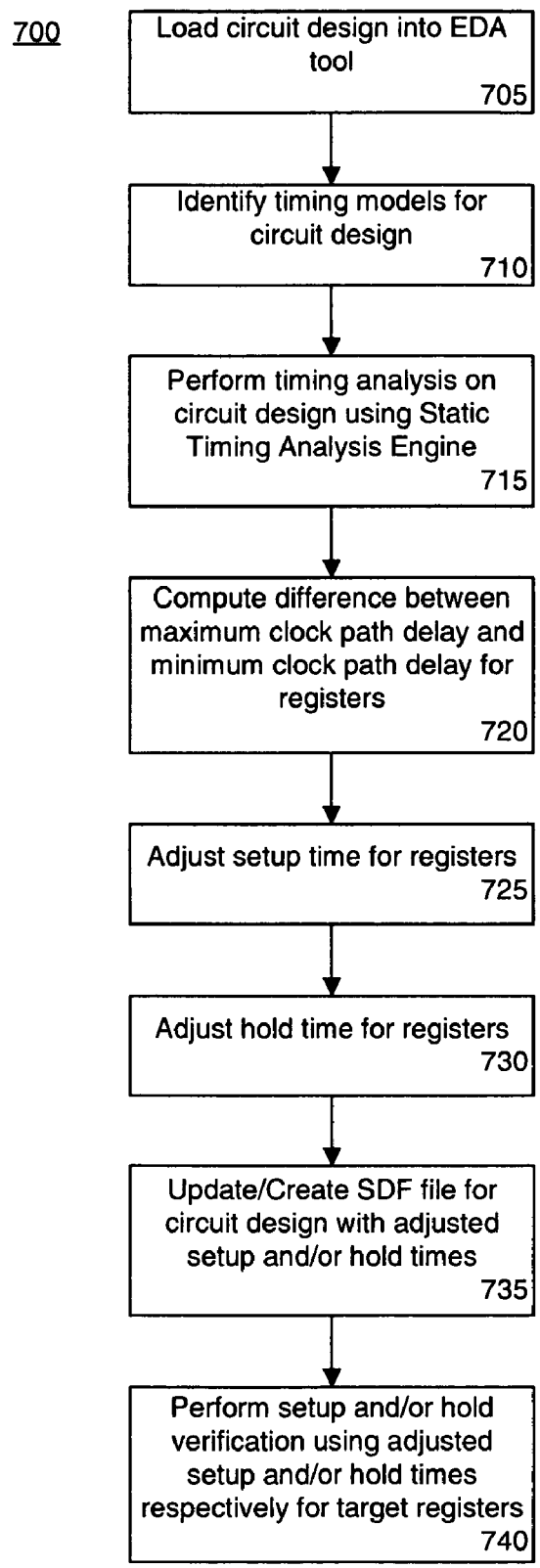
FIG. 7 is a flow chart illustrating a method of annotating delay information for a circuit design in accordance with another embodiment of the present invention.

FIG. 7 is a flow chart illustrating a method 700 of annotating delay information for a circuit design in accordance with another embodiment of the present invention. Method 700 can begin in step 705 where a circuit design is loaded into an EDA tool. In one embodiment, for example, the circuit design can be loaded into an EDA tool such as a netlist generator. The circuit design can be specified using any of a variety of hardware design languages or other programmatic representations.

In step 710, timing models for the various components and/or subsystems identified by the circuit design can be identified. The EDA tool can call a Static Timing Analysis Engine (STAE) to perform a more detailed timing analysis upon the circuit design. Accordingly, in step 715, the STAE performs a static timing analysis upon the circuit design. An STAE, in general, is capable of performing more complex timing calculations than a functional timing analysis tool. Static timing analysis, for example, reflects delay variations that may occur during normal operation of a circuit design. In illustration, an STAE, in contrast to a functional timing analysis tool, can account for phenomena including, but not limited to, clock skew, clock uncertainty, and the like.

In one embodiment of the present invention, the STAE can be implemented as the Xilinx Timing Analyzer, which is commercially available from Xilinx, Inc. of San Jose, Calif. The Xilinx Timing Analyzer is a software-based tool that performs static timing analysis on FPGA or complex programmable logic device (CPLD) designs. This analysis is performed after mapping, placing, and routing to create detailed timing reports for the circuit design. The Xilinx Timing Analyzer is presented as one possible STAE which can be used with the embodiments described herein. The embodiments are not intended to be limited, however, by the particular STAE that is used to determine static timing information for the circuit design as any suitable STAE can be used.

In any case, the static timing analysis performed by the STAE can determine a minimum clock path delay and a maximum clock path delay for the various clocked registers of the circuit design. In step 720, the STAE can determine a difference between the maximum clock path delay and the minimum clock path delay for the clocked registers of the circuit design. In step 725, the setup time for the registers can be adjusted. As noted, the setup time for each register can be incremented by the amount of the difference computed in step 720. In step 730, the hold time for each register can be adjusted, or incremented, by the difference calculated in step 720.

In step 735, an SDF file corresponding to the circuit design can be created or updated as the case may be. The SDF file specifies setup and hold information for clocked registers using a construct which includes what is known as a delay tuple. That is, the SDF file typically includes a construct that specifies a minimum, typical, and maximum setup and/or hold time for each such register. In accordance with one embodiment of the present invention, the adjusted hold time can be stored as the minimum value in such a tuple, while the adjusted setup time can be stored as the maximum value in the tuple. The typical, or middle, value in the tuple can remain unchanged. Examples of constructs of the SDF file that may be modified using the static timing analysis data can include, but are not limited to, SETUP, HOLD, and SETUPHOLD.

In step 740, the EDA tool can perform setup verification using the adjusted setup time values and hold verification using the adjusted hold times for the target registers of the circuit design. More particularly, when setup verification is performed for a given register, a maximum clock path delay is used for the source register. The adjusted setup time emulates the use of a minimum clock path delay for the destination register. As noted, the data path between the source and destination registers can be considered to have a maximum path delay.

When hold verification is performed for a given register, a minimum clock path delay is used for the source register. The adjusted hold time emulates the use of a maximum clock path delay for the destination register. The data path between the source and the destination registers can be considered to have a minimum path delay.

It should be appreciated that although method 700 illustrates the case where both setup and hold times can be adjusted for a given circuit design, each can be adjusted independently of the other. Further, the particular location and/or construct within the SDF that is altered, or adjusted, may vary according to the particular EDA tool used. By annotating the setup and hold times for registers within an SDF file as discussed, more accurate dynamic timing analysis can be performed on a given circuit design.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically, i.e., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of annotating timing information for a circuit design for performing timing analysis, said method comprising:
   determining a minimum clock path delay and a maximum clock path delay for a destination register of the circuit design;
   computing a difference between the maximum clock path delay and the minimum clock path delay for the destination register;
   adjusting a setup time for the destination register by an amount equivalent to the difference; and
   performing setup verification for the destination register using the adjusted setup time, wherein the adjusted setup time for the destination register approximates the minimum clock path delay for the destination register, in combination with the maximum clock path delay for the destination register, a source maximum clock path delay for a source register, and a measure of maximum data path delay between the source register and the destination register.

2. The method of claim 1, said determining step comprising executing a static timing analysis engine to determine the minimum and maximum clock path delays.

3. The method of claim 1, said adjusting step comprising increasing the setup time for the destination register by an amount equal to the difference computed between the maximum clock path delay and the minimum clock path delay for the destination register.

4. The method of claim 1, further comprising specifying the adjusted setup time for the destination register within a Standard Delay Format file corresponding to the circuit design.

5. A method of annotating timing information for a circuit design for performing timing analysis, said method comprising:
   determining a minimum clock path delay and a maximum clock path delay for a destination register of the circuit design;
   computing a difference between the maximum clock path delay and the minimum clock path delay for the destination register;
   adjusting a hold time for the destination register by an amount equivalent to the difference; and
   performing hold verification for the destination register using the adjusted hold time, wherein the adjusted hold time for the destination register approximates the maximum clock path delay for the destination register, in combination with the minimum clock path delay for the destination register, a source minimum clock path delay for a source register, and a measure of minimum data path delay between the source register and the destination register.

6. The method of claim 5, said determining step comprising executing a static timing analysis engine to determine the minimum and maximum clock path delays.

7. The method of claim 5, said adjusting step further comprising increasing the hold time for the destination register by an amount equal to the difference calculated between the maximum clock path delay and the minimum clock path delay for the destination register.

8. The method of claim 5, further comprising specifying the adjusted hold time for the destination register within a Standard Delay Format file corresponding to the circuit design.

9. A machine readable storage, having stored thereon a computer program having a plurality of code sections executable by a processor comprising:
   code for determining minimum and maximum clock path delays for registers of a circuit design;
   code for computing a difference between the maximum clock path delay and the minimum clock path delay for a destination register of the circuit design;
   code for adjusting a register timing parameter for the destination register according to the difference, wherein the adjusted register timing parameter approximates a minimum clock path delay for the destination register for setup verification and a maximum clock Path delay for the destination register for hold verification; and
   code for performing a timing verification on the destination register using the adjusted register timing parameter;
   Wherein the register timing parameter specifies setup time of the destination register;

Wherein said code for adjusting a register timing parameter further comprises code for increasing the setup time of the destination register by an amount equivalent to the difference;

Wherein said code for performing a timing verification further comprises code for performing setup verification, wherein the setup verification using the adjusted setup time approximates a calculation for setup verification of the destination register using a maximum clock path delay for a source register and a minimum clock path delay for the destination register; and Wherein said code for performing a timing verification further comprises code for incorporating a measure of maximum data path delay between the source register and the destination register.

10. The machine readable storage of claim 9, further comprising code for specifying the adjusted register timing parameter within a Standard Delay Format file.

11. The machine readable storage of claim 9, wherein the register timing parameter specifies hold time of the destination register, said code for adjusting a register timing parameter further comprising code for increasing the hold time of the destination register by an amount equivalent to the difference.

12. The machine readable storage of claim 11, said code for performing a timing verification further comprising code for performing hold verification, wherein the hold verification using the adjusted hold time approximates a calculation for hold verification of the destination register using a minimum clock path delay for a source register and a maximum clock path delay for the destination register.

13. The machine readable storage of claim 12, said code for performing a timing verification further comprising code for incorporating a measure of minimum data path delay between the source register and the destination register.

\* \* \* \* \*